United States Patent [19]
Golnabi

[11] Patent Number: 5,485,467
[45] Date of Patent: Jan. 16, 1996

[54] VERSATILE RECONFIGURABLE MATRIX BASED BUILT-IN SELF-TEST PROCESSOR FOR MINIMIZING FAULT GRADING

[75] Inventor: Habibollah Golnabi, Dallas, Tex.

[73] Assignee: VLSI Technology, Inc., San Jose, Calif.

[21] Appl. No.: 127,270

[22] Filed: Sep. 24, 1993

[51] Int. Cl.$^6$ .......................... G06F 11/267; G06F 11/27; G01R 31/3185; G01R 31/3187
[52] U.S. Cl. ........................................ 371/22.5; 371/22.3
[58] Field of Search ................................ 371/22.3, 15.1, 371/10.3, 22.4, 22.5, 22.1, 22.6; 395/150, 162, 164, 166

[56] References Cited

U.S. PATENT DOCUMENTS

| | | | |
|---|---|---|---|
| 4,357,703 | 11/1982 | Van Brunt | 371/15 |
| 4,635,261 | 1/1987 | Anderson et al. | 371/22.4 |
| 4,701,920 | 10/1987 | Resnick et al. | 371/22.5 |
| 4,736,373 | 4/1988 | Schmidt | 371/10.3 |
| 4,912,709 | 3/1990 | Teske et al. | 371/22.1 |
| 4,945,536 | 7/1990 | Hancu | 371/22.3 |
| 5,173,906 | 12/1992 | Dreibelbis et al. | 371/22.5 |

OTHER PUBLICATIONS

Edward J. McCluskey, *Built–In Self–Test Techniques*, IEEE Design & Test, vol. 2, No. 2, Apr. 1985, pp. 21–28.
Edward J. McCluskey, *Built–In Self–Test Structures*, IEEE Design & Test, vol. 2, No. 2, Apr. 1985, pp. 29–36.
M. Nicolaidis, et al. *Silicon Compilation of Hierarchical Control Sections With Unified BIST Testability*, Microprocessors, vol. 15, No. 5, Jun. 1991, London GB, pp. 257–269.

Primary Examiner—Emanuel T. Voeltz
Assistant Examiner—Edward Pipala
Attorney, Agent, or Firm—Douglas L. Weller

[57] ABSTRACT

A built-in self-test circuitry includes a design under test and a self-test processor. Included within the design under test is a plurality of scan row registers. The self-test processor includes a command processing section and a signal generating section. The command processing section receives information which indicates the configuration of the scan row registers. The signal generating section generates control signals which control the built-in self-testing of the circuit. The control signals are based on the information received by the command processing section. In the preferred embodiment, the command processing section includes a shift section, a load section, and a signature section. The shift section receives information which indicates a number of bits in each scan row register. The load section receives information which indicates a number of loads into the scan row registers. The signature section receives information which indicates a bit length of signature registers used to generate a checksum. The signature section additionally receives information which indicates a number of scan row registers.

8 Claims, 11 Drawing Sheets

VERSATILE RECONFIGURABLE MATRIX BASED BUILT-IN SELF-TEST PROCESSOR FOR MINIMIZING FAULT GRADING

BACKGROUND

This invention relates generally to fault detection in the manufacture of integrated circuits and more specifically to a versatile reconfigurable matrix based processor used for built-in self-testing of circuits.

Once manufactured, it is necessary to test very large scale integrated (VLSI) circuits to detect processing faults which could impair or inhibit correct operation of the circuit. Typically, this has been done by the external application of various test stimuli to inputs of the circuit and checking the actual response with an expected response.

As the complexity of some circuits increase, it is increasingly difficult to thoroughly test such circuits using just the external application of test stimuli. To facilitate testing of these more complex circuits, built-in self-test (BIST) circuitry is often included within the manufactured circuit to serve as an aid in the testing process. See for example, Edward J. McCluskey, *Built-In Self-Test Techniques, IEEE Design & Test*, Volume 2, Number 2, April 1985, pages 21–28. See also, Edward J. McCluskey, *Built-In Self-Test Structures, IEEE Design & Test*, Volume 2, Number 2, April 1985, pages 29–36.

In the prior art, one or more shift registers (called a scan path or scan chain) are used to generate input for the testing. Generally a hard-wired controller is used to generate the necessary control signals for the scan chain.

One disadvantage to the above-described prior systems is that a different hard-wired controller generally needs to be re-designed every time a different design configuration is generated. The process of re-designing a hard-wired controller during each fault grading process requires significant engineering development time and CPU time.

SUMMARY OF THE INVENTION

In accordance with the preferred embodiment of the present invention, built-in self-test circuitry within an integrated circuit is presented. The built-in self-test circuitry includes a design under test and a self-test processor. Included within the design under test is a plurality of scan row registers. The self-test processor includes a command processing means and a signal generating means. The command processing means receives information which indicates the configuration of the scan row registers. The signal generating means generates control signals which control the built-in self-testing of the circuit. The control signals are based on the information received by the command processing means.

In the preferred embodiment, the command processing means includes a shift means, a load means, and a signature means. The shift means receives information which indicates a number of bits in each scan row register. The load means receives information which indicates a number of loads into the scan row registers. The signature means receives information which indicates a bit length of signature registers used to generate a checksum. The signature means additionally receives information which indicates a number of scan row registers.

The present invention has several advantages over the prior art. For example, the present invention allows for a designer to change a design under test without redesigning a built-in self-testing controller. In the preferred embodiment of the present invention, the designer can change the number of scan row registers, the length of each scan row register, the number of loads into the scan row registers and the length of signature registers, all without making any hardware changes to a test controller. Instead, a BIST processor is programmed using just three commands. A fourth command is used to read out a final checksum.

DESCRIPTION OF THE PREFERRED EMBODIMENT

The preferred embodiment of the present invention is a built-in self-test processor which allows a user to issue software commands to reconfigure the necessary timing control signals to achieve a high fault coverage. This system minimizes the engineering development time for reconfiguration. The preferred embodiment of the present invention allows a variety of built-in self-test designs which can be used to test circuits having in the range of 1000 to 100,000 or more gates. Reconfiguration of the necessary timing signals can be accomplished by issuing software commands, without changing a hard-wired controller.

Figure 1:
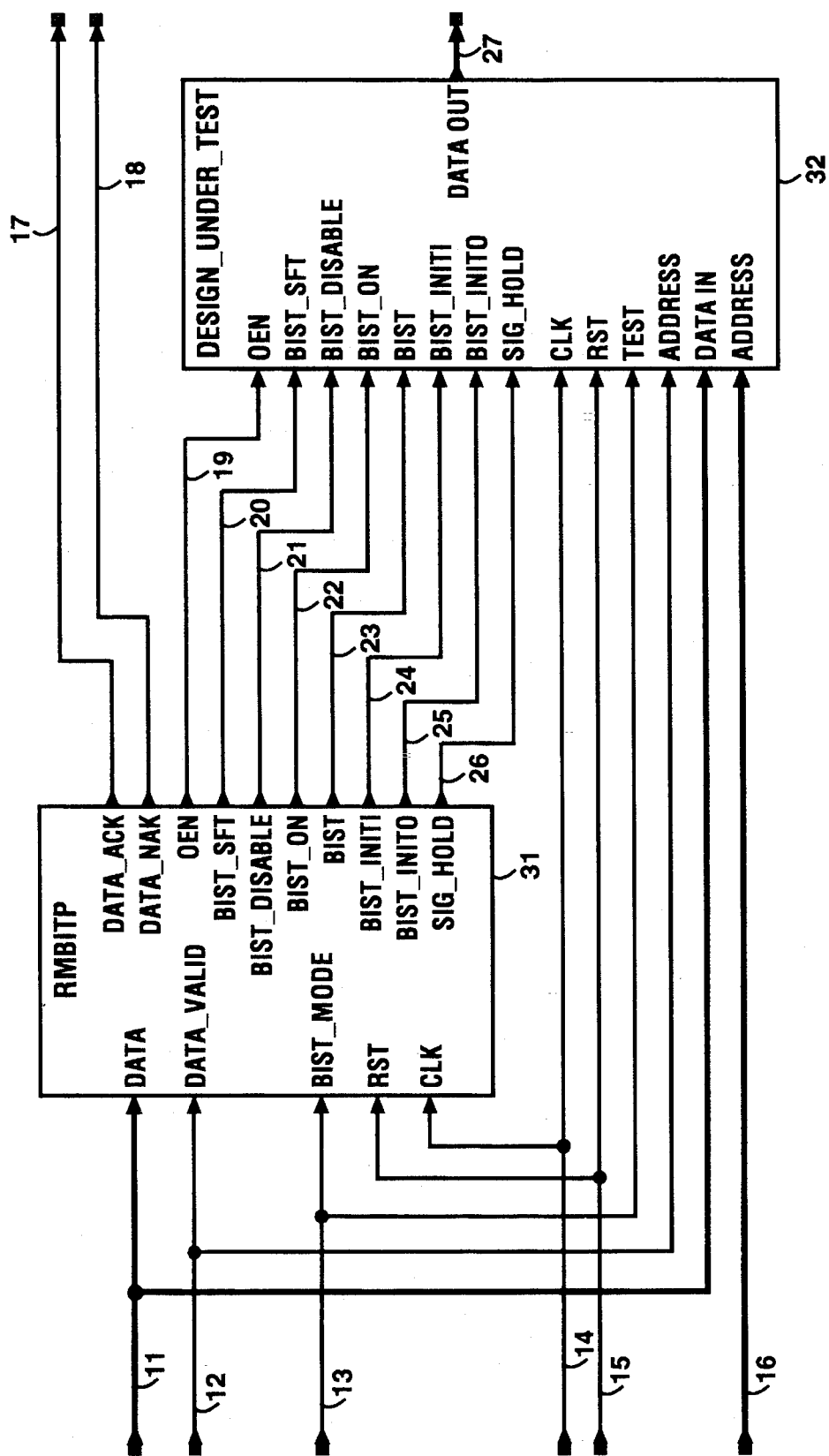
FIG. 1 shows a reconfigurable matrix based built in self-test processor (RMBIT) connected to a design under test in accordance with the preferred embodiment of the present invention.

FIG. 1 shows a reconfigurable matrix based built-in self-test processor (RMBIT) 31 connected to a design under test 32 in accordance with the preferred embodiment of the present invention. Both RMBIT 31 and design under test 32 receive as input eight bits of data on data in data input bus 11, a data valid signal on a data valid line 12, a built-in self-test (BIST) mode signal on a BIST mode line 13, a reset (RST) signal on a RST line 15 and a clock (CLK) signal on a CLK line 14. In addition, design under test 32 receives as input from RMBITP 31 an output enable (OEN) signal on a line 19, a BIST disable signal on a line 21, a BIST shift signal on a line 20, a BIST on signal on a line 22, a BIST signal on a line 23, a BIST initi signal on a line 24, a BIST inito on a line 25, and a BIST hold signal on a line 26. In addition, RMBITP generates a data acknowledge signal on a line 17 and a data not acknowledge signal on a line 18. Depending upon the particular implementation, design under test 32 may also receive as input an additional address lines 16. Design under test 32 places eight bits of output data (or sixteen bits of output depending upon the signature length) on a data output bus 27.

Figure 2:
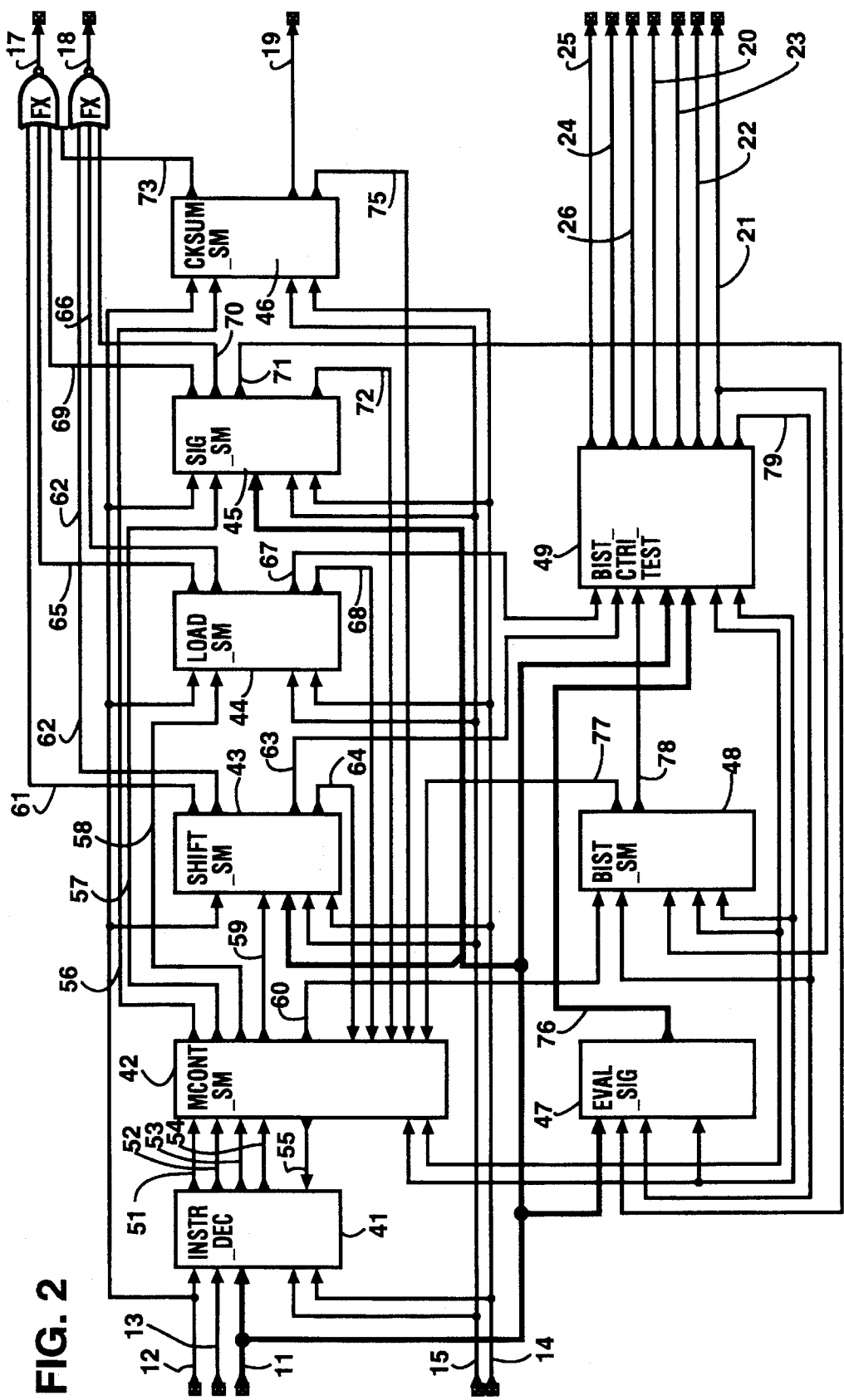
FIG. 2 shows a block diagram of the reconfigurable matrix based built in self-test processor (RMBIT) shown in FIG. 1 in accordance with the preferred embodiment of the present invention.

FIG. 2 shows a block diagram of RMBIT 31. RMBIT 31 includes an instruction decoder 41, a master control state machine 42, a shift state machine 43, a load state machine 44, a signature state machine 45, a checksum state machine 46, an evaluate signature logic block 47, a built-in self-test state machine 48 and a built-in self-test control test logic block 49.

Instruction decoder 41 generates a shift command signal on a line 51, a load command signal on a line 52, a signature command signal on a line 53 and a checksum command signal on a line 54. Master control state machine 42 produces a disable command signal on a line 55, a checksum go signal on a line 56, a signature go signal on a line 57, a load go signal on a line 58, a shift go signal on a line 59, a built-in self-test go signal on a line 60. Shift state machine 43 produces a shift acknowledge signal on a line 61 and a shift not acknowledge signal on a line 62, a shift select signal on a line 63 and a shift done signal on a line 64.

Load state machine 44 produces a load acknowledge signal on a line 65 and a load not acknowledge signal on a line 66, a load select signal on a line 67 and a load done signal on a line 68. Signature state machine 45 produces a signature acknowledge signal on a line 69 and a signature not acknowledge signal on a line 70, a signature select signal on a line 71 and a signature done signal on a line 72. Checksum state machine 46 produces a checksum acknowledge signal on a line 73, a checksum select/output enable signal on line 19 and a checksum done signal on a line 75.

Evaluate signature logic block 47 generates an eight bit data signature signal on lines 76. Built-in self-test state machine 48 generates a built-in self-test done signal on a line 77 and a do built-in self-test signal on a line 78. Built-in self-test control test logic block 49 produces BIST disable signal on line 21, BIST shift signal on line 20, BIST on signal on line 22, BIST signal on line 23, BIST initi signal on line 24, BIST inito signal on line 25, BIST hold signal on line 26, a BIST finito (BIST done) signal on a line 79.

Figure 3:
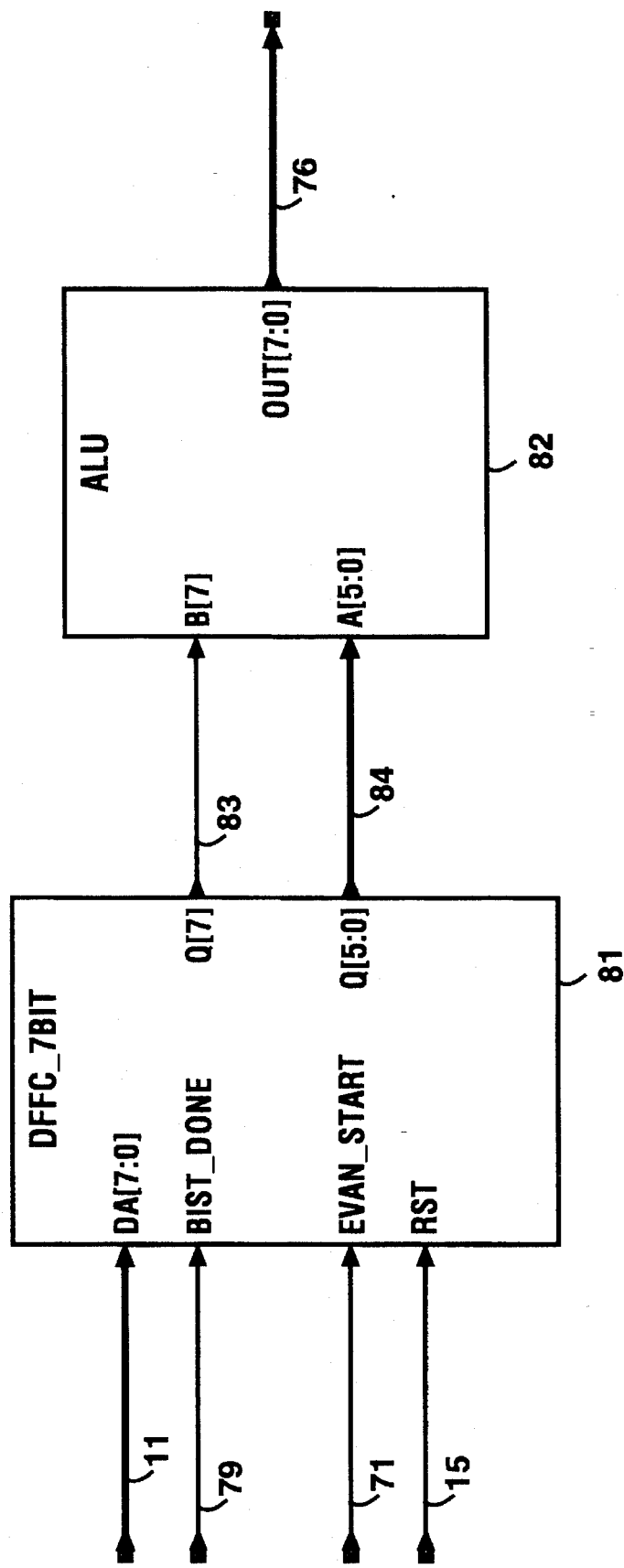
FIG. 3 shows a block diagram of an evaluate signature block within the reconfigurable matrix based built in self-test processor (RMBIT) shown in FIG. 2 in accordance with the preferred embodiment of the present invention.

FIG. 3 shows a block diagram of evaluate signature block 47. Evaluate signature block 47 includes seven bit registers 81 and an arithmetic logic unit (ALU) 82. Seven bit registers 81 produce six data bits on lines 84 and a single data bit on a line 83.

Figure 4:
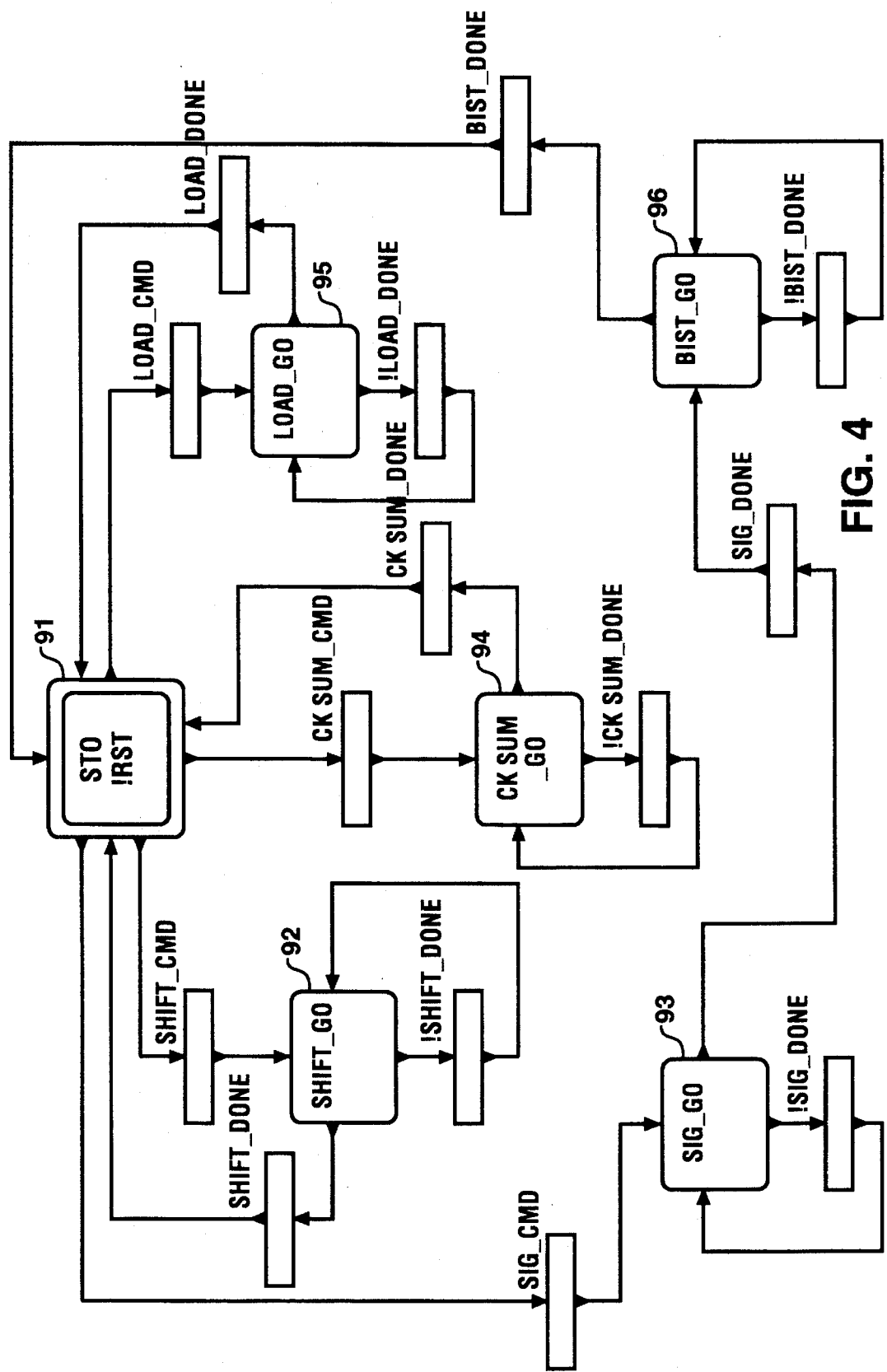
FIG. 4 shows the command sequence of a master controller state machine within the reconfigurable matrix based built in self-test processor (RMBIT) shown in FIG. 2 in accordance with the preferred embodiment of the present invention.

FIG. 4 shows the command sequence of master controller state machine 42. The command sequence of master controller state machine 42 is initialized (and reset) to a state zero 91. Upon receiving a shift command signal on line 51, master controller state machine 42 enters a shift go state 92. In shift go state 92 master controller state machine 42 waits for the shift done signal on line 64. Upon receiving the shift done signal, master controller state machine 42 returns to state zero 91.

Upon receiving a load command signal on line 52, master controller state machine 42 enters a load go state 95. In load go state 95 master controller state machine 42 waits for the load done signal on line 68. Upon receiving the load done signal, master controller state machine 42 returns to state zero 91.

Upon receiving a signature command signal on line 53, master controller state machine 42 enters a signature go state 93. In signature go state 93 master controller state machine 42 waits for the signature done signal on line 72. Upon receiving the signature done signal, master controller state machine 42 enters a built-in self-test go state 96. In built-in self-test go state 96 master controller state machine 42 waits for the built-in self-test done signal on line 77. Upon receiving the built-in self-test done signal, master controller state machine 42 returns to state zero 91.

Upon receiving a checksum command signal on line 54, master controller state machine 42 enters a checksum go state 94. In checksum go state 94 master controller state machine 42 waits for the checksum done signal on line 75. Upon receiving the checksum done signal, master controller state machine 42 returns to state zero 91.

Figure 5:
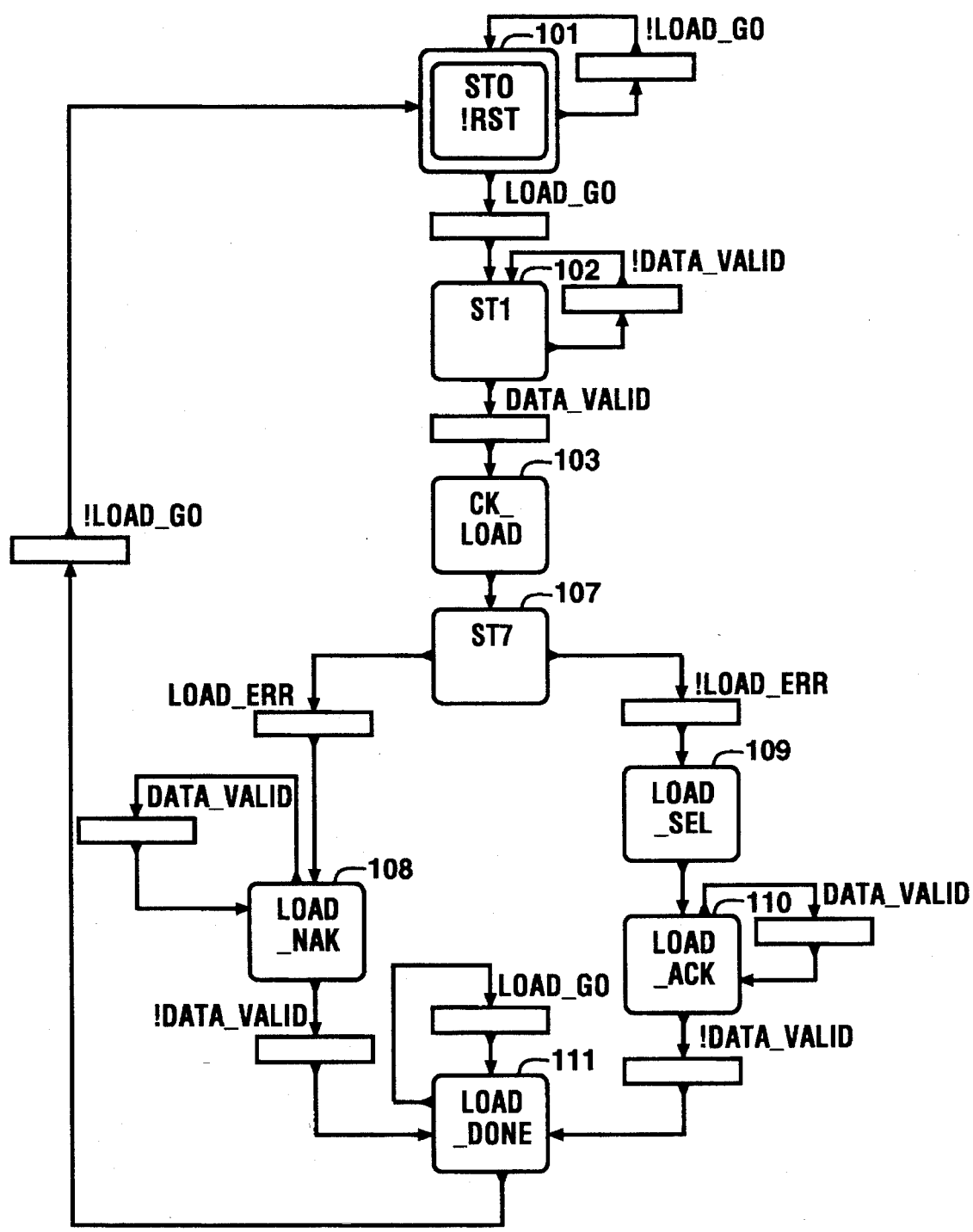
FIG. 5 shows the command sequence of a load state machine within the reconfigurable matrix based built in self-test processor (RMBIT) shown in FIG. 2 in accordance with the preferred embodiment of the present invention.

FIG. 5 shows the command sequence of load state machine 44. The command sequence of load state machine 44 is initialized (and reset) to a state zero 101. In state zero 101, load state machine 44 waits for the load go signal on line 58. Upon receiving the load go signal, load state machine 44 enters state one 102. In state one 102, load state machine 44 waits for the data valid signal on line 12. Upon receiving the data valid signal, load state machine 44 enters check load state 103. From check load state 103, load state machine 44 enters state seven 107.

In state seven 107, upon receiving the internally generated (within load state machine 44) load error signal (asserted high), load state machine 44 enters load not acknowledge state 108. In load not acknowledge state 108, load state machine 44 waits while the data valid signal is asserted on line 12.

When the data valid signal is no longer asserted, load state machine 44 enters a load done state 111. In load done state 111, load state machine 44 waits while the load go signal is asserted on line 58. When the load go signal is no longer asserted, load state machine 44 returns to state zero 101.

In state seven 107, when the internally generated load error signal is asserted low, load state machine 44 enters load select state 109. From load select state 109, load state machine 44 enters load acknowledge state 110. In load acknowledge state 110, load state machine 44 waits while the data valid signal is asserted on line 12. When the data valid signal is no longer asserted, load state machine 44 enters load done state 111.

Figure 6:
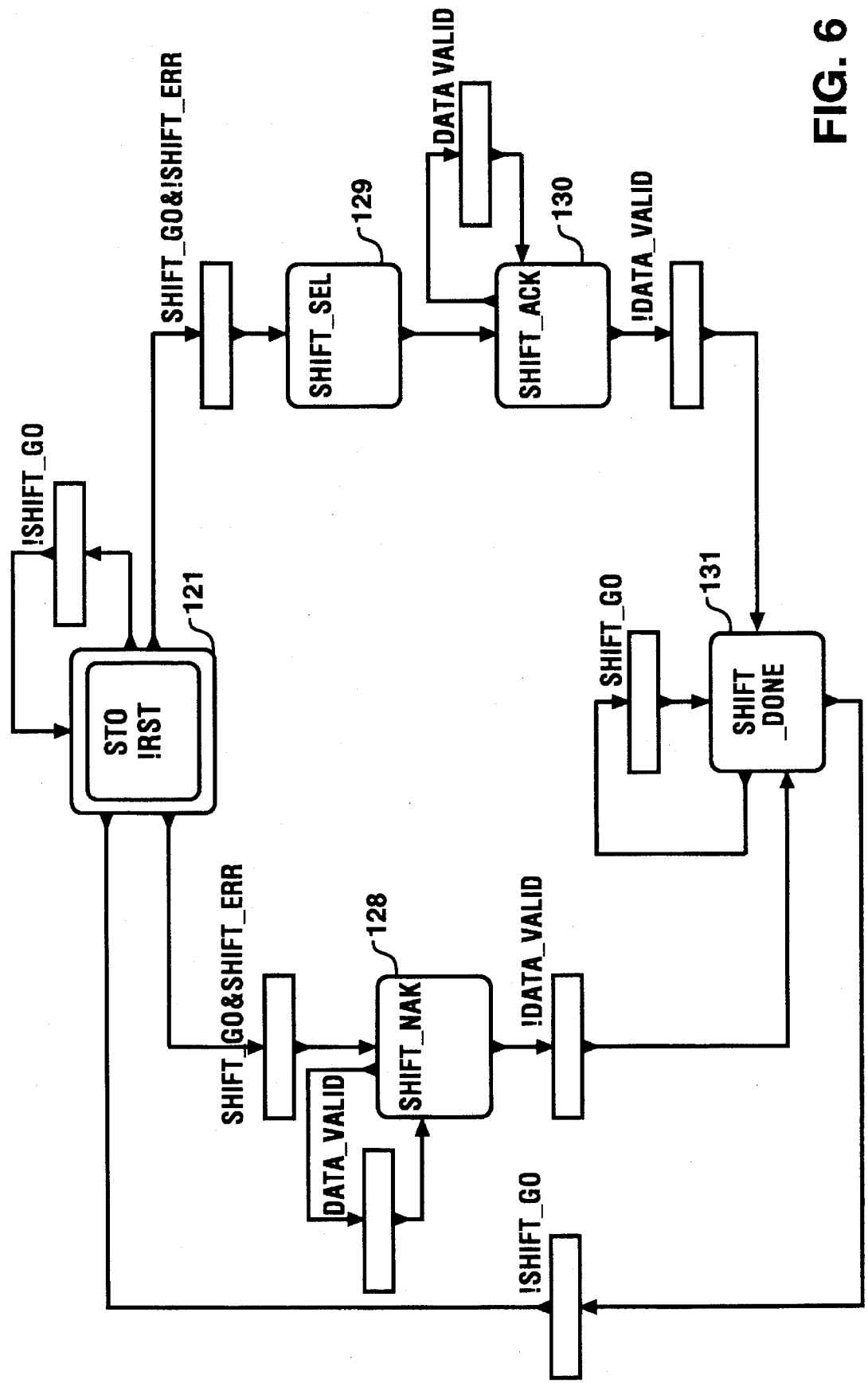
FIG. 6 shows the command sequence of a shift state machine within the reconfigurable matrix based built in self-test processor (RMBIT) shown in FIG. 2 in accordance with the preferred embodiment of the present invention.

FIG. 6 shows the command sequence of shift state machine 43. The command sequence of shift state machine 43 is initialized (and reset) to a state zero 121. In state zero 121, shift state machine 43 waits for the shift go signal on line 59. When the shift go signal on line 59 is asserted and the internally generated (within shift state machine 43) shift error signal is asserted, shift state machine 43 enters shift not acknowledge state 128. In shift not acknowledge state 128, shift state machine 43 waits while the data valid signal is asserted on line 12. When the data valid signal is no longer asserted, shift state machine 43 enters a shift done state 131. In shift done state 131, shift state machine 43 waits while the shift go signal is asserted on line 59. When the shift go signal is no longer asserted, shift state machine 43 returns to state zero 121.

In state zero 121, when the shift go signal on line 59 is asserted and the internally generated shift error signal is not asserted, shift state machine 43 enters shift select state 129. From shift select state 129, shift state machine 43 enters shift acknowledge state 130. In shift acknowledge state 130, shift state machine 43 waits while the data valid signal is asserted on line 12. When the data valid signal is no longer asserted, shift state machine 43 enters shift done state 131.

Figure 7:
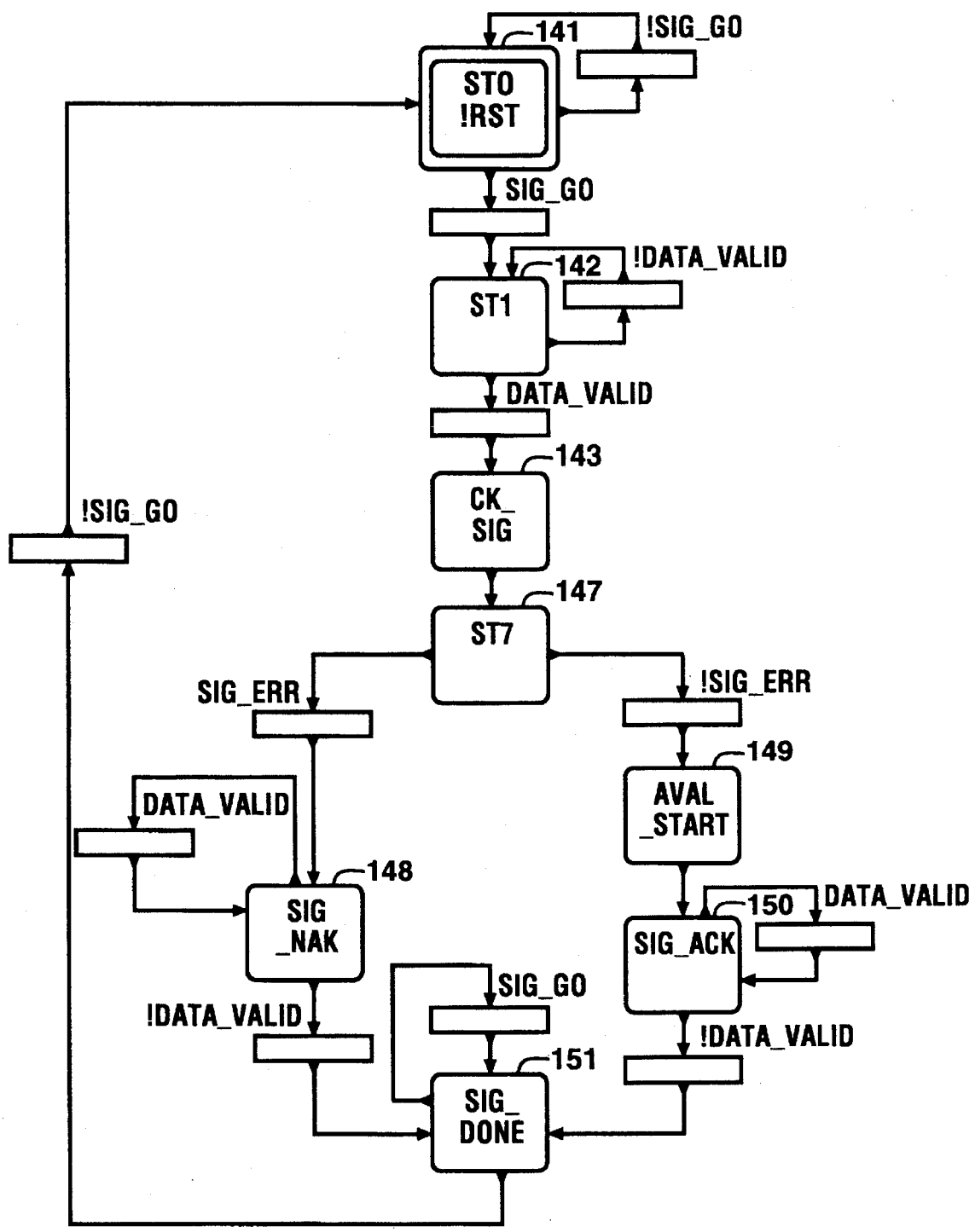
FIG. 7 shows the command sequence of a signature state machine within the reconfigurable matrix based built in self-test processor (RMBIT) shown in FIG. 2 in accordance with the preferred embodiment of the present invention.

FIG. 7 shows the command sequence of signature state machine 45. The command sequence of signature state machine 45 is initialized (and reset) to a state zero 141. In state zero 141, signature state machine 45 waits for the signature go signal on line 57. Upon receiving the signature go signal, signature state machine 45 enters state one 142. In state one 142, signature state machine 45 waits for the data valid signal on line 12. Upon receiving the data valid signal, signature state machine 45 enters check signature state 143. From check signature state 143, signature state machine 45 enters state seven 147.

In state seven 147, upon receiving the internally generated (within signature state machine 45) signature error signal (asserted high), signature state machine 45 enters signature not acknowledge state 148. In signature not acknowledge state 148, signature state machine 45 waits while the data valid signal is asserted on line 12. When the data valid signal is no longer asserted, signature state machine 45 enters a signature done state 151. In signature done state 151, signature state machine 45 waits while the signature go signal is asserted on line 57. When the signature go signal is no longer asserted, signature state machine 45 returns to state zero 141.

In state seven 147, upon the internally generated signature error signal being asserted low, signature state machine 45 enters signature select state 149. From signature select state 149, signature state machine 45 enters signature acknowledge state 150. In signature acknowledge state 150, signature state machine 45 waits while the data valid signal is asserted on line 12. When the data valid signal is no longer asserted, signature state machine 45 enters signature done state 151.

Figure 8:
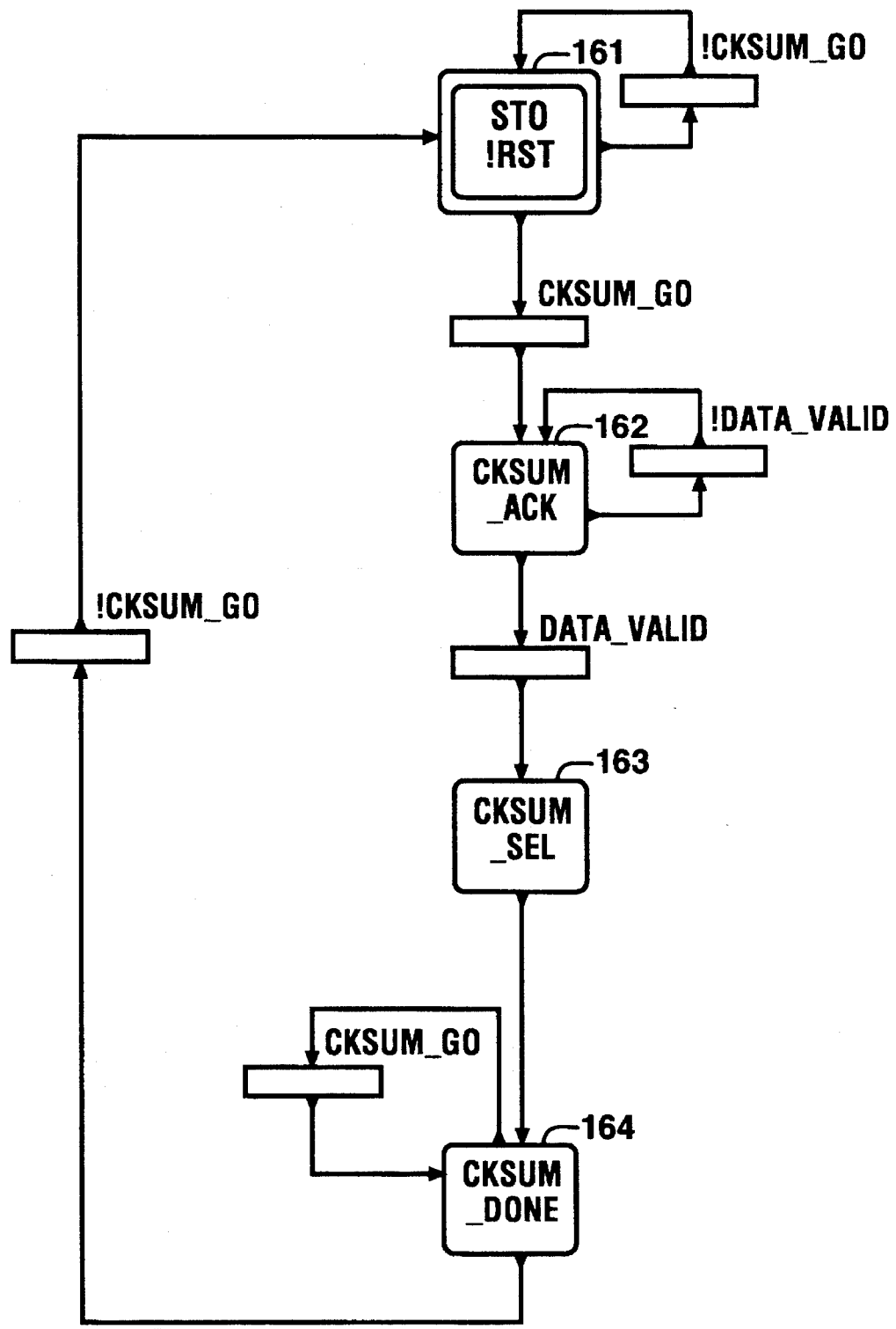
FIG. 8 shows the command sequence of a checksum state machine within the reconfigurable matrix based built in self-test processor (RMBIT) shown in FIG. 2 in accordance with the preferred embodiment of the present invention.

FIG. 8 shows the command sequence of checksum state machine 46. The command sequence of checksum state machine 46 is initialized (and reset) to a state zero 161. In state zero 161, checksum state machine 46 waits for the checksum go signal on line 56. Upon receiving the checksum go signal, checksum state machine 46 enters a checksum acknowledge state 162. In checksum acknowledge state 162, checksum state machine 46 waits while the data valid signal is asserted on line 12. When the data valid signal is no longer asserted, checksum state machine 46 enters a checksum select state 163. From check checksum state 163, checksum state machine 46 enters a checksum done state 164. In checksum done state 164, checksum state machine 46 waits while the checksum go signal is asserted on line 56. When the checksum go signal is no longer asserted, checksum state machine 46 returns to state zero 161.

Figure 9:
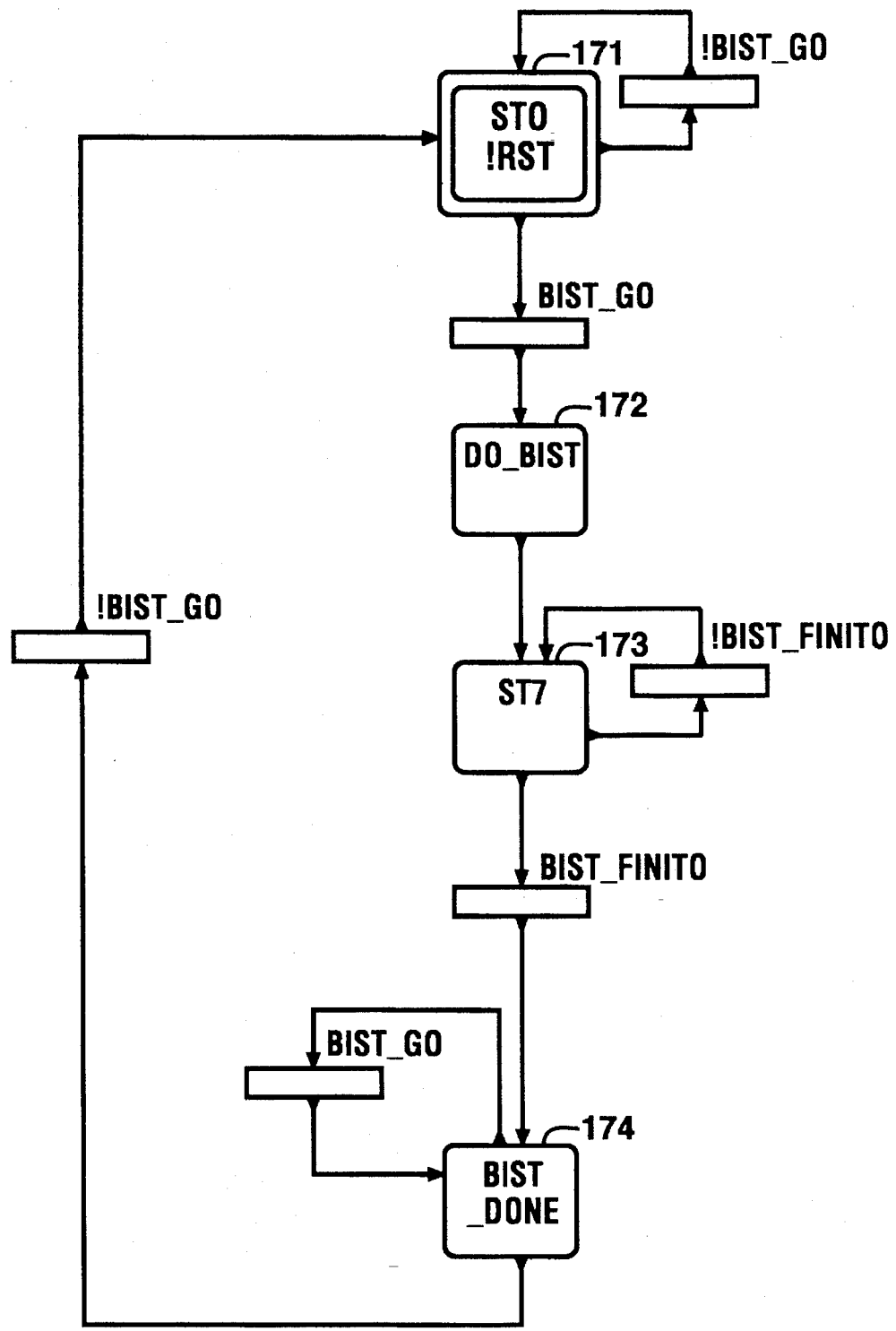
FIG. 9 shows the command sequence of a built-in self-test (BIST) state machine within the reconfigurable matrix based built in self-test processor (RMBIT) shown in FIG. 2 in accordance with the preferred embodiment of the present invention.

FIG. 9 shows the command sequence of built-in self-test state machine 48. The command sequence of built-in self-test state machine 48 is initialized (and reset) to a state zero 171. In state zero 171, built-in self-test state machine 48 waits for the built-in self-test go signal on line 60. Upon receiving the built-in self-test go signal, built-in self-test state machine 48 enters do built-in self-test state 172. From do built-in self-test state 172, built-in self-test state machine 48 enters a state seven 173. In state seven 173, built-in self-test state machine 48 waits for the built-in self-test finito signal on line 79. Upon receiving the built-in self-test finito signal, built-in self-test state machine 48 enters a built-in self-test done state 174. In built-in self-test done state 174, built-in self-test state machine 48 waits while the built-in self-test go signal is asserted on line 60. When the built-in self-test go signal is no longer asserted, built-in self-test state machine 48 returns to state zero 171.

The command format for commands to RMBITP 31 is either eight or sixteen bits wide. In the preferred embodiment, RMBITP 31 recognizes four commands.

Figure 10:
FIG. 10 shows a command data structure for a Shift command in accordance with the preferred embodiment of the present invention.

Shift command data format 201 for a shift command is shown in FIG. 10. The two most significant bits (MSB) of shift command data format 201 are at S1=0, and S0=1. The six least significant bits (LSB) specify the number of columns (length) of a scan array or number of shifts in a scan row. In the preferred embodiment, the valid range is from 1 to 63. "0" is an invalid shift. After a valid shift command, the number of shifts is latched and a data acknowledge (ACK) is sent back. However, if the number of shifts is 0, a data not acknowledged (NACK) is sent back.

Figure 11:
FIG. 11 shows a command data structure for a Load command in accordance with the preferred embodiment of the present invention.
Figure 11:

Two-byte load command data format 211 and 212 for a load command is shown in FIG. 11. The two most significant bits (MSB) of load command data format data byte 211 are at S1=1, and S0=0. The bits of load command data format data byte 212 specify the number of loads minus one to be used in each row scan array. After receiving a valid number of loads RMBITP 31 issues a data ACK signal. In the preferred embodiment, a valid number of loads is 2 through 511. If RMBITP 31 receives a 0 or 1 for a number of loads, then RMBITP 31 returns a data NACK.

Figure 12:
FIG. 12 shows a command data structure for a Signature command in accordance with the preferred embodiment of the present invention.
Figure 12:

Two-byte signature command data format 221 and 222 for a signature command is shown in FIG. 12. The two most significant bits (MSB) of signature command data format data byte 221 are at S1=1, and S0=1. The MSB ("F") of signature command data format data byte 222 is a status bit. The six LSB of signature command data format data byte 222 specify the number of scan rows. If the number of scan rows is zero, RMBITP 31 returns a data NACK.

When Status bit F equals 0, there is an eight-bit signature. When Status bit F equals 1, there is a sixteen-bit signature. When the status bit F is equal to 0, and the maximum number of rows in the scan array is less than or equal to 63, or if the status bit F is equal to 1 and the maximum number of rows in the scan array is less than or equal to 31, then evaluate signature block 47 will compute the number of shifts for the signature scan column vector registers by using Formula I below:

Formula 1 SS=(N−1)*L

In Formula 1, "N" is the number of scan rows, "L" is the length of signature register (8 or 16) and "SS" is the number of shifts in the signature scan column vector registers. After finishing the computation, RMBITP 31 will respond with a data ACK and proceed with the built-in self-test.

Built-in self-test state machine 48 operates after a valid signature command is received. RMBITP 31 will first initialize the design and then perform a built-in self-test. When finished RMBITP 31 will re-initialize the entire design except for a checksum register which will contain the final BIST signature.

Figure 13:
FIG. 13 shows a command data structure for a Checksum command in accordance with the preferred embodiment of the present invention.

Checksum command data format 231 for a checksum command is shown in FIG. 13. The two most significant bits (MSB) of checksum command data format 201 are at S1=0, and S0=0. Upon receiving a valid checksum command, RMBITP 31 will issue a data ACK. The OEN signal on line 19 is enabled and the content of the checksum register (which will contain the final BIST signature value) are read out from the data output bus on lines 27.

As shown in FIG. 1, RMBITP 31 and design under test 32 share inputs. Design under test 32 is placed in built-in self-test mode when test signal on line 13 is asserted. The software commands shift, load, signature and checksum, discussed previously, are forwarded to RMBITP 31 using data input bus 11 and are qualified with the data valid signal on line 12. Upon receipt of a valid command, RMBITP 31 will respond with a data ACK. If the command is invalid, then RMBITP 31 will issue a data NACK. After receiving a valid shift command, a valid load command and a valid signature command, RMBITP 31 will proceed with the initialization of design under test 32 by asserting the BIST initi signal on line 24. Then RMBITP 31 will assert the BIST on signal on line 22 indicating that the built-in self-test has started. At this point, design under test 32 utilizes "N" pseudo random number generators which provide different seeds for "N" scan rows. At the end of each scan row, a signature analyzer determines the signature of each scan row. The control of shift/load for each scan row is done with the BIST signal on line 23. When the BIST signal is at logic 0, the data on the scan row registers are shifted into the signature analyzer. When the BIST signal is high, the data from the random logic portions of design under test 32 are loaded into scan row registers. After completion of the number of loads and the number of shifts defined with the load command and shift command, respectively, the data in the multiple N signature registers are shifted into the final signature registers when the BIST shift signal on line 20 is asserted low. At this point, RMBITP 31 will de-assert the BIST on signal on line 22 indicating the built-in self-test is finished. Then RMBITP 31 re-initializes design under test 32 by activating the BIST inito signal on line 25. This places design under test 32 to return to a known state where normal operation can begin.

When the BIST inito signal on line 25 is active, the signature hold signal on line 26 is activated to guard the contents of signature (checksum) register from being effected while initialization is in process. The BIST disable signal on line 21 is used internally in RMBITP 31 and externally for design under test 32 to block different logic (e.g., BIST state machine 48, power on reset circuitry or watch dog circuitry) from being tested. The checksum register containing the final signature value is read out by issuing the checksum command.

Figure 14:
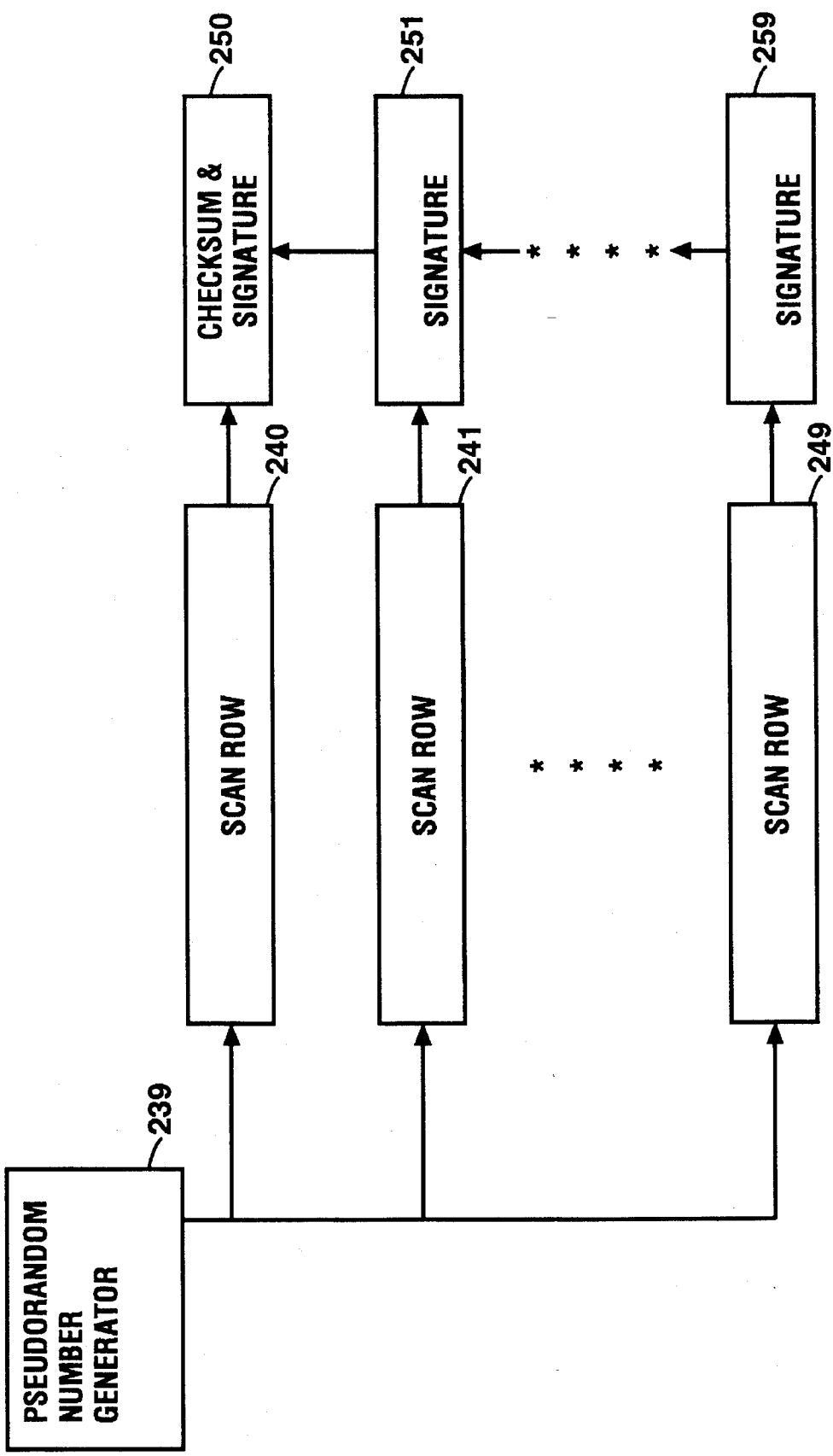
FIG. 14 shows built-in self-test circuitry within the device under test shown in FIG. 1 in accordance with the preferred embodiment of the present invention.

FIG. 14 illustrates the BIST matrix within design under test 32. Each scan matrix includes "N" number of scan rows. For illustration, FIG. 14 shows a scan row 240, a scan row 241 and a scan row 249. Each scan row is "M" number of bits in length. For each built-in self-test, a pseudo random generates a number P of loads for the test.

Each scan row has a signature register. For example, in FIG. 14, signature register 250, signature register 251 and signature register 259 are shown. The signature register has a width L of either eight or sixteen bits. In signature register 250 for the first scan row also serves as the final checksum register. The other signature registers (not including signature register 250) are considered together to be a signature scan column vector with a length SS which is equal to (N−1)*L.

For example, a design which has $R_T$=M*N=1800 flip-flops and on which will be tested with P=500 loads, various matrix arrangements may be used. For example, a scan matrix with a number of scan rows N=60, scan row length of M=30, and a signature width L of eight may be used. In that case, signature scan column vector length SS is equal to (N−1)*L, or 472 shifts. Alternately, for example, a scan matrix with a number of scan rows N=30, scan row length M=60, and a signature width L of sixteen may be used. In that case, signature scan column vector length SS is equal to (N−1)*L, or 464 shifts.

Regardless of the configuration chosen by the designer, the testing may be performed without any hardwire change in RMBITP 31. Specifically, in order to perform the built-in self-test for either design, RMBITP 31 obtains various information about design under test 31 to generate the necessary control signals for the built-in self-test. The information gathered is as follows. RMBITP 31 obtains the scan array dimension M from the Shift Command. RMBITP 31 obtains the number of loads (P) from the Load command. RMBITP 31 obtains the number of scan rows (N) from the Signature command. RMBITP 31 obtains the length L of the scan rows from the Status bit F of the Signature command. SS is then calculated from formula 1 above.

Under the direction of RMBITP 31, pseudo random number generator 239 will generate M pseudo random numbers. One bit of each pseudo-random number will be shifted into the scan row registers. After M pseudo random numbers (and M shifts), the contents of each scan row are loaded as input into combinational logic portions of the design under test 32. The observed results of combinational logic are then loaded back into the scan rows. Then the contents of each scan row will be combined into its associated signature registers. This is repeated for P number of loads. Upon completion of P loads, the contents of the signature registers are combined into a single checksum and signature register 250. SS number of shifts are used to perform this combination into checksum and signature register 250. The checksum then is read out of checksum and signature register 250 in order to be compared with an expected checksum.

The foregoing discussion discloses and describes merely exemplary methods and embodiments of the present invention. Therefore, as will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for controlling built-in self-testing of a circuit in which during self-testing scan row registers within the circuit provide input to combination logic and output from the combination logic is utilized to generate a checksum, the method comprising the steps of:

(a) receiving, by a self-test processor within the circuit, configuration information which indicates the configuration of the scan row registers, the configuration information including information which indicates a number of bits in each scan row register; and, (b) generating, by the self-test processor, control signals which control the built-in self-testing of the circuit, the control signals including signals which control data transfer to the scan row register, the control signals being based on the configuration information received in step (a).

2. A method as in claim 1 wherein step (a) includes the following substep:

(a.1) receiving, by the self-test processor within the circuit, information which indicates a number of scan row registers.

3. A method as in claim 2 wherein step (a) additionally includes the substep of:

(a.2) receiving, by the self-test processor within the circuit, information which indicates a bit length of signature registers used to generate a checksum.

4. A method as in claim 3 wherein step (a) additionally includes the substep of:

(a.3) receiving, by the self-test processor within the circuit, information which indicates a number of loads into the scan row registers.

5. Built-in self-test circuitry within an integrated circuit, the built-in self-test circuitry comprising:

a design under test including a plurality of scan row registers; and, a self-test processor, coupled to the design under test, the self-test processor including:

command processing means for receiving configuration information which indicates the configuration of the scan row registers, the configuration information including information which indicates a number of bits in each scan row register, and signal generating means, coupled to the command processing means, for generating control signals which control the built-in self-testing of the circuit, the control signals being based on the configuration information received by the command processing means.

6. Built-in self-test circuitry as in claim 5 wherein the command processing means includes:

shift means for receiving the information which indicates the number of bits in each scan row register.

7. Built-in self-test circuitry as in claim 6 wherein the command processing means additionally includes:

load means for receiving information which indicates a number of loads into the scan row registers.

8. Built-in self-test circuitry as in claim 7 wherein the command processing means additionally includes:

signature means for receiving information which indicates a bit length of signature registers used to generate a checksum and for receiving information which indicates a number of scan row registers.

\* \* \* \* \*